(12) United States Patent
Park et al.

(10) Patent No.: US 8,741,096 B2
(45) Date of Patent: Jun. 3, 2014

(54) APPARATUS FOR SEMICONDUCTOR PROCESSING

(75) Inventors: Sang-Jun Park, Yongin (KR); Ho-Young Lee, Daejeon (KR); Chun-Woo Lee, Cheongju (KR)

(73) Assignee: Wonik IPS Co., Ltd. (KR)

( * ) Notice: Subject to any disclaimer, the term of this patent is extended or adjusted under 35 U.S.C. 154(b) by 946 days.

(21) Appl. No.: 11/770,117

(22) Filed: Jun. 28, 2007

(65) Prior Publication Data
US 2008/0000422 A1    Jan. 3, 2008

(30) Foreign Application Priority Data

Jun. 29, 2006  (KR) .................. 10-2006-0059670
May 23, 2007  (KR) .................. 10-2007-0050222

(51) Int. Cl.
*C23F 1/08*      (2006.01)
*C23C 16/00*     (2006.01)
*H01L 21/677*    (2006.01)

(52) U.S. Cl.
USPC ............... 156/345.31; 156/345.32; 118/719; 118/733; 414/217; 414/935; 414/939

(58) Field of Classification Search
USPC ............... 118/719, 733; 156/345.31, 345.32; 414/217, 939
See application file for complete search history.

(56) References Cited

U.S. PATENT DOCUMENTS

| | | | |
|---|---|---|---|
| 4,816,638 A | | 3/1989 | Okai et al. |
| 4,927,484 A | * | 5/1990 | Mitomi .................. 156/345.32 |
| 5,388,944 A | * | 2/1995 | Takanabe et al. ............. 414/217 |
| 5,667,592 A | * | 9/1997 | Boitnott et al. .............. 118/719 |
| 6,045,315 A | * | 4/2000 | Azumano et al. ............. 414/217 |
| 6,111,225 A | * | 8/2000 | Ohkase et al. ................. 219/390 |
| 6,235,656 B1 | * | 5/2001 | Clarke .......................... 438/800 |
| 6,296,712 B1 | | 10/2001 | Guo et al. |
| 6,746,195 B2 | * | 6/2004 | Shirai ........................... 414/217 |
| 6,765,178 B2 | * | 7/2004 | Shang et al. ................... 219/405 |
| 6,814,813 B2 | | 11/2004 | Dando et al. |
| 7,658,586 B2 | * | 2/2010 | Niewmierzycki et al. ..... 414/217 |
| 2004/0149214 A1 | * | 8/2004 | Hirose et al. .................. 118/715 |
| 2005/0034664 A1 | * | 2/2005 | Koh et al. ..................... 118/719 |
| 2005/0160990 A1 | * | 7/2005 | Lubomirsky et al. ......... 118/728 |
| 2005/0236092 A1 | | 10/2005 | Kim et al. |
| 2007/0212484 A1 | * | 9/2007 | Li .............................. 427/248.1 |

FOREIGN PATENT DOCUMENTS

| | | |
|---|---|---|
| KR | 10-0234539 B1 | 12/1996 |
| KR | 1998-0011811 | 4/1998 |
| KR | 2002011625 A * | 2/2002 |
| KR | 1020020011625 | 2/2002 |
| KR | 10-2002-0076536 | 6/2004 |
| WO | 2005015613 | 2/2005 |
| WO | WO 2005015613 A2 * | 2/2005 |

* cited by examiner

*Primary Examiner* — Karla Moore
(74) *Attorney, Agent, or Firm* — Cantor Colburn LLP

(57) ABSTRACT

An apparatus for semiconductor processing capable of performing semiconductor processing such as etching, depositing, etc. on a surface of a substrate such as a wafer. The apparatus for semiconductor processing, comprises: a reaction chamber having a gate through which a substrate to be processed is transferred; one or more shower heads disposed at an upper side of the reaction chamber, for spraying gas so as to perform semiconductor processing; one or more wafer supporting units disposed at an inner lower side of the reaction chamber in correspondence to each of the shower heads, for supporting the substrate; a processing space forming unit disposed in the reaction chamber, for forming a processing space for semiconductor processing by sealing the shower heads and the wafer supporting units; and an exhausting system connected to the processing space forming unit for controlling a pressure and air exhaustion inside the reaction chamber and the processing space formed by the processing space forming unit.

11 Claims, 6 Drawing Sheets

APPARATUS FOR SEMICONDUCTOR PROCESSING

BACKGROUND OF THE INVENTION

1. Field of the Invention

The present invention relates to an apparatus for semiconductor processing, and more particularly, to an apparatus for semiconductor processing capable of performing semiconductor processing such as etching, depositing, etc. on a surface of a substrate such as a wafer.

2. Description of the Related Art

The Korean Patent Publication No. 10-0364089 discloses an apparatus for semiconductor processing having one pair of wafer supporting units.

FIG. 1 is a cross-sectional view showing an apparatus for semiconductor processing in accordance with the conventional art, and FIG. 2 is a vertical-sectional view taken along line 'A-A' in FIG. 1.

As shown in FIGS. 1 and 2, the conventional apparatus for semiconductor processing comprises a processing chamber 10 having one pair of wafer supporting units 12, and a transferring chamber 60 having one pair of transferring robots 30.

The one pair of wafer supporting units 12 are disposed in the processing chamber 10. The processing chamber 10 is hermetically maintained by a gate valve 54 installed between the processing chamber 10 and the transferring chamber 60 after a substrate 1 is mounted on the wafer supporting unit 12 by the transferring robot 30. In the hermetic processing chamber 10, semiconductor processing such as etching, depositing, annealing, etc. are performed.

However, the conventional apparatus for semiconductor processing, especially, the conventional apparatus disclosed in the Korean Patent Publication No. 10-0364089 having a plurality of wafer supporting units has the following problems.

First, since a processing space for performing semiconductor processing is asymmetrically formed on the basis of a substrate, uniform processing conditions are not formed in the processing chamber.

Second, wafer supporting units inside the processing chamber are not separated from each other, inferior processes such as reaction gas occurrence, gas mixture, interference of plasma sources, etc. are caused thus to lower a reliability of semiconductor processing.

Third, a waiting time for cooling a processed substrate is increased thus to increase an entire time for the semiconductor processing. Accordingly, a productivity is lowered.

Fourth, as the entire time for the semiconductor processing is increased, the substrate is exposed to the air for a long time thus to be contaminated by dust or foreign materials. Accordingly, a yield for the semiconductor processing is lowered.

SUMMARY OF THE INVENTION

Therefore, an object of the present disclosure is to provide an apparatus for semiconductor processing capable of enhancing a reliability of an entire processing by forming a uniform processing atmosphere by symmetrically forming processing spaces on the basis of a substrate.

Another object of the present disclosure is to provide an apparatus for semiconductor processing capable of enhancing a reliability of an entire processing by separating processing spaces formed by a plurality of wafer supporting units from each other.

Still another object of the present disclosure is to provide an apparatus for semiconductor processing capable of shortening an entire processing time by reducing a waiting time for cooling a processed substrate by additionally providing a cassette unit, and capable of minimizing contamination of the substrate by dust or foreign materials by preventing the substrate from being exposed to the air.

Yet still another object of the present disclosure is to provide an apparatus for semiconductor processing capable of applying an optimum condition for performing semiconductor processing to each processing space.

To achieve these and other advantages and in accordance with the purpose of the present disclosure, as embodied and broadly described herein, there is provided an apparatus for semiconductor processing, comprising: a reaction chamber having a gate through which a substrate to be processed is transferred; one or more shower heads disposed at an upper side of the reaction chamber, for spraying gas so as to perform semiconductor processing; one or more wafer supporting units disposed at an inner lower side of the reaction chamber in correspondence to each of the shower heads, for supporting the substrate; a processing space forming unit disposed in the reaction chamber, for forming and sealing a processing space for semiconductor processing surrounding the shower heads and the wafer supporting units; and an exhausting system connected to the processing space forming unit for controlling a pressure and air exhaustion inside the reaction chamber and the processing space formed by the processing space forming unit.

A transferring unit for transferring a substrate to be processed to the wafer supporting units, or for carrying out a substrate having been processed through the gate may be further provided between the wafer supporting units and the gate.

The transferring unit may be implemented as one or more robot arms having one end connected to a rotation driving unit disposed at the reaction chamber, and another end reciprocatingly-rotating between the wafer supporting units and the gate, for transferring the substrate. The robot arms may be disposed with different heights from each other so as to prevent interference from each other when rotated.

A cassette unit for loading a plurality of substrates may be further disposed between the transferring unit and the gate. The cassette unit may be disposed so as to be vertically movable by a driving unit. The cassette unit may comprise a temperature controller for controlling a temperature of a substrate to be loaded.

The processing space forming unit may be implemented as a cylinder valve disposed in the reaction chamber so as to be vertically movable and forming the processing space when upwardly moved. The cylinder valve may be connected to an exhaustion pipe connected to the exhausting system.

A gas injecting unit for injecting gas to an edge portion of a substrate so as to prevent the substrate from being deposited may be further provided at the cylinder valve.

The gas injecting unit may include a gas injecting ring having a plurality of injection holes at an inner side of the cylinder valve, the gas injecting ring being connected a gas supplying unit installed outside by a gas supplying pipe.

A temperature controller for controlling a temperature of the cylinder valve according to a condition of semiconductor processing may be further provided in the cylinder valve.

A liner for protecting a sealing member may be further provided at an inner wall of the cylinder valve. Herein, a lower end of the liner may be extending to be lower than a bottom surface of a substrate so as to prevent a plasma occurrence.

An end of the cylinder valve is stepped between the processing space and an outer surface of the cylinder valve so as to protect the sealing member. Also, a portion of the cylinder valve where the sealing member is installed has a different height from a portion contacting the processing space.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present disclosure, examples of which are illustrated in the accompanying drawings.

An apparatus for semiconductor processing according to the present invention will be explained in more detail.

Figure 1:
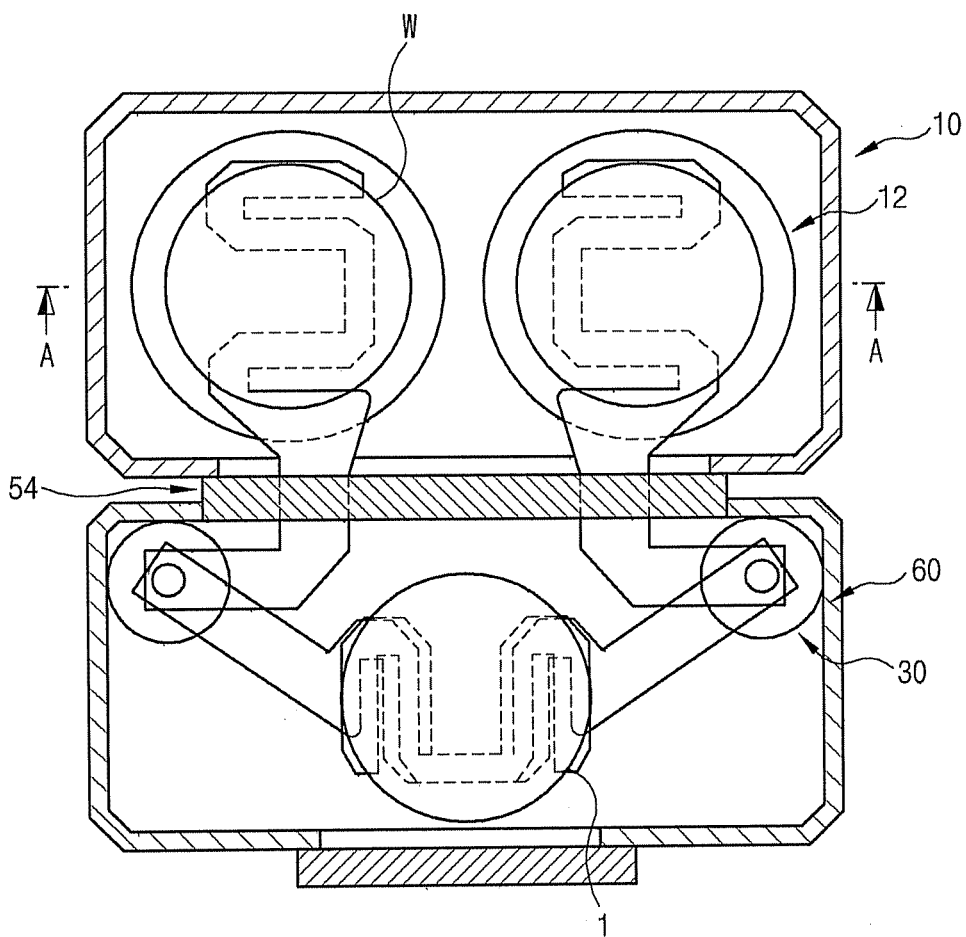
FIG. 1 is a cross sectional view showing an apparatus for semiconductor processing in accordance with the conventional art.
Figure 2:
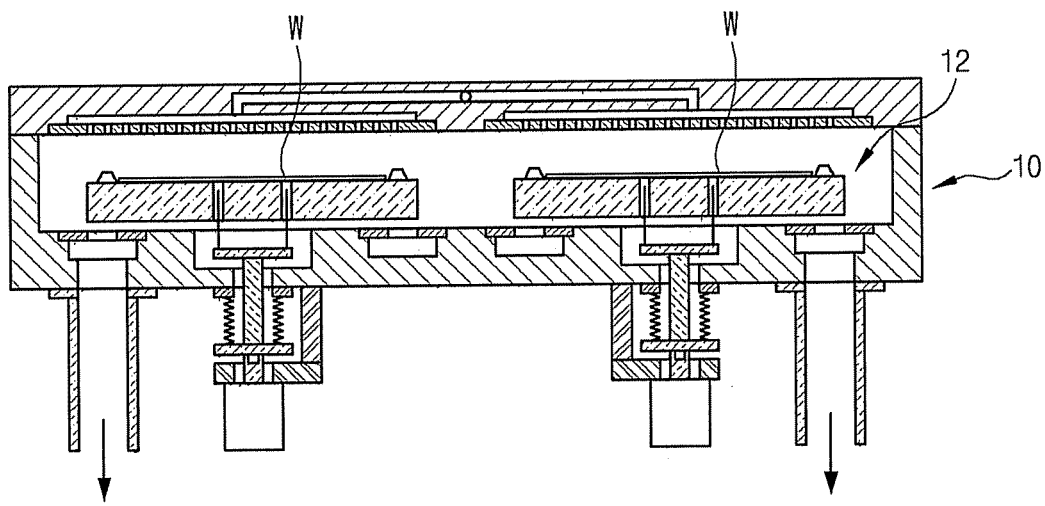
FIG. 2 is a vertical-sectional view taken along line 'A-A' in FIG. 1.
Figure 3:
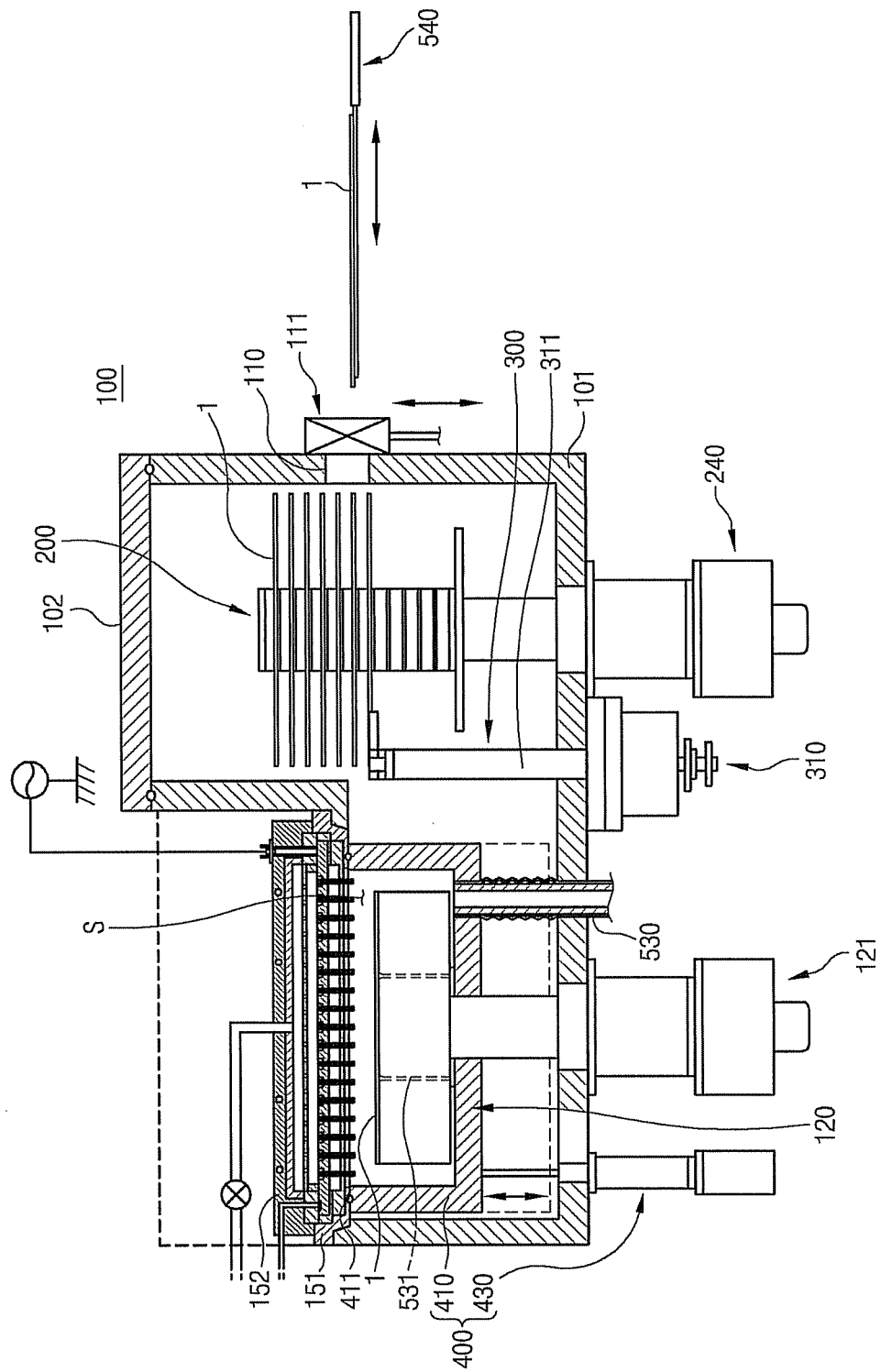
FIG. 3 is a vertical sectional view showing an apparatus for semiconductor processing according to the present invention.
Figure 4:
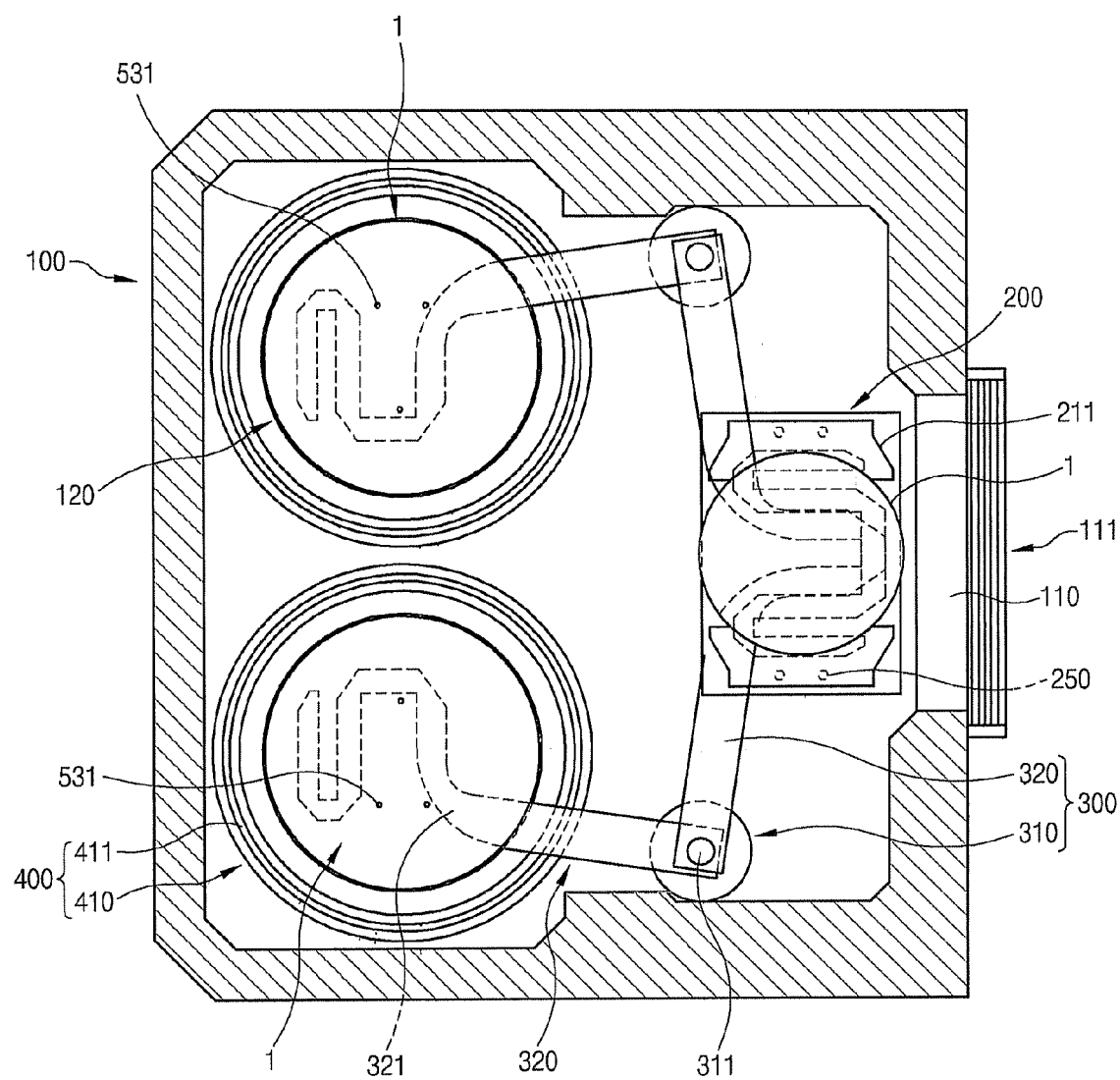
FIG. 4 is a cross-sectional view of the apparatus for semiconductor processing of FIG. 3.
Figure 5:
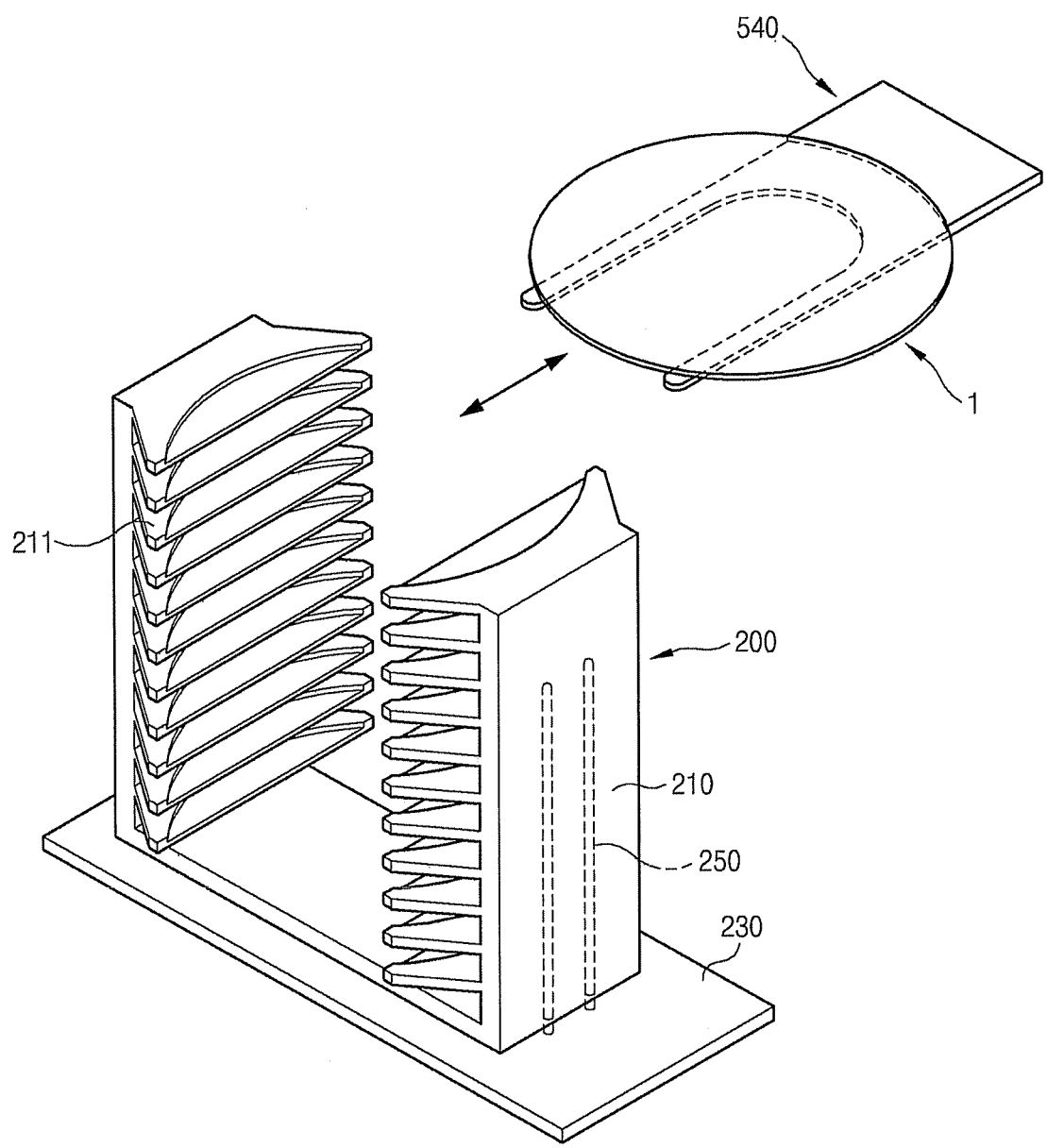
FIG. 5 is a perspective view showing a cassette of the apparatus for semiconductor processing of FIG. 3.

As shown in FIGS. 3 to 5, the apparatus for semiconductor processing according to the present invention includes: a reaction chamber 100 having a gate 110 through which a substrate 1 to undergo semiconductor processing is transferred; one or more wafer supporting units 120 disposed at an inner lower side of the reaction chamber 100 for supporting the substrate 1; a processing space forming unit disposed in the reaction chamber 100 so as to be vertically reciprocated, for forming a processing space S for semiconductor processing by sealing a space including the wafer supporting units 120; and an exhausting system connected to the processing space forming unit for exhausting gas inside the processing space S.

The reaction chamber 100 may be implemented as an assembly composed of a lower chamber 101 and an upper cover 102 coupled to the lower chamber 101. The lower chamber 101 is formed so that an upper surface thereof can be partially opened. A lower plate 151 for installing a gas supplying system, a power supplying unit, a shower head for injecting gas into the processing space S, etc. is disposed at the opened portion of the lower chamber 101. An upper plate 152 for covering the reaction chamber 100 may be disposed at an upper side of the shower head.

The gate 110 is formed at a side wall of the reaction chamber 100 for transferring the substrate 1, and is opened and closed by a gate door 111.

A transferring robot 540 for transferring the substrate 1 is disposed outside the gate 110. Through the gate 110, the transferring robot 540 transfers the substrate 1 to be semiconductor-processed to a cassette unit 200 or carries out the processed substrate 1.

An exhausting system for exhausting gas, byproduct, etc. remaining in the reaction chamber 100 after controlling an inner pressure of the reaction chamber 100 and performing semiconductor processing is disposed in the reaction chamber 100. The exhausting system is connected to a vacuum pump (not shown) through an exhaustion pipe 530 so as to maintain inside of the reaction chamber 100 in a vacuum atmosphere. The exhaustion pipe 530 may be variously disposed according to an installation condition, etc. The exhaustion pipe 530 is directly connected to the processing space forming unit so as to control an inner pressure and gas exhaustion of a processing space S formed by the processing space forming unit.

In the present invention, since the exhaustion pipe 530 connected to the vacuum pump is connected to the processing space forming unit, an inner pressure of the reaction chamber 100 can be maintained as a pressure lower than the atmospheric pressure by the exhaustion pipe 530. Also, when semiconductor processing is to be performed, a pressure inside the processing space S formed by the processing space forming unit is maintained as a vacuums state by the exhaustion pipe 530. Accordingly, semiconductor processing is performed in the processing space S.

The wafer supporting unit 120 supports the substrate 1 so as to perform semiconductor processing such as heating, depositing, and etching on the substrate 1, and may be variously implemented as a stage heater, an electrostatic chuck, a susceptor, etc.

The wafer supporting unit 120 is installed so as to be vertically movable by a driving unit 121 disposed below the reaction chamber 100.

The wafer supporting unit 120 may be provided with a plurality of lift pins 531 for supporting the substrate 1 transferred by a transferring unit 300 and mounting the substrate 1 to a supporting surface of the wafer supporting unit 120 by moving downward when the wafer supporting unit 120 upwardly moves.

The processing space forming unit is implemented by sealing a space that surrounds the shower head and the wafer supporting unit 120 so as to form a separate space inside the reaction chamber 100. That is, the processing space S is configured to be separated from a peripheral space so as to perform semiconductor processing such as depositing and etching at a space that surrounds the wafer supporting unit 120 where the substrate 1 is mounted. The processing space forming unit may be variously implemented and modified.

For instance, the processing space forming unit may be implemented as a cylinder valve 400 disposed in the reaction chamber 100 so as to be vertically movable and forming a processing space S together with a lower surface of the lower plate 151 when upwardly moved. Herein, a sealing member 411 for sealing the processing space S is disposed at an upper surface of the processing space forming unit or a lower surface of the lower plate 151.

The processing space forming unit may be configured to form the processing space S by contacting a protrusion (not shown) formed at the shower head or the reaction chamber 100 rather than the lower surface of the lower plate 151.

That is, the cylinder valve 400, as the processing space forming unit may include a cylinder valve body 410 for opening and closing the processing space S, and a driving unit 430 for vertically moving the cylinder valve body 410 up and down.

The cylinder valve body 410 is vertically moved up and down by the driving unit 430. As the cylinder valve body 410 is moved upward, a space including the shower head and the wafer supporting unit 120 is closed thus to form the processing space S for semiconductor processing.

The cylinder valve body 410 may have various sectional shapes as well as a circular sectional shape, a polygonal sectional shape. The exhaustion pipe 530 is connected to a lower surface of the cylinder valve body 410.

As the cylinder valve 400 in accordance with the present invention has a symmetrical structure, a uniform processing condition can be implemented in the chamber at the time of semiconductor processing. Also, the wafer supporting units 120 inside the chamber are separated from each other, inferior processes such as reaction gas occurrence, gas mixture, interference of a plasma source, etc. are not caused.

The cylinder valve 400 may be configured in plurality in numbers so that a plurality of processing spaces S can be formed. A different semiconductor processing may be performed in each of the processing space S. That is, the substrate 1 undergoes an etching process at the first processing space S, and then is transferred to the next processing space S via the cassette unit 200 thus to undergo a depositing process. The apparatus for semiconductor processing according to the present may simultaneously and/or successively perform various semiconductor processes to the substrate 1 such as an etching process and a depositing process in the plurality of processing spaces S.

The apparatus for semiconductor processing according to the present disclosure may includes a transferring unit 300 for transferring the substrate 1 between the wafer supporting unit 120 and the gate 110, and a cassette unit 200 for loading the substrate 1 before or after semiconductor processing.

The transferring unit 300 is disposed between the wafer supporting unit 120 and the gate 110, and transfers the substrate 1 to be processed to the wafer supporting unit 120 or carries out the processed substrate 1.

The transferring unit 300 may include one or more robot arms 320 having one end connected to a rotation shaft 311 of a rotation driving unit 310 disposed at the reaction chamber 100, and another end reciprocatingly-rotating between the wafer supporting units 120 and the gate 110, for transferring the substrate 1. As shown in FIG. 4, the robot arm 320 is provided with a mounting portion 321 for mounting the substrate 1 at an end thereof. The mounting portion 321 may have various shapes such as 'S' and a fork shape.

The transferring unit 300 may be configured as one pair of robot arms 320 independently rotated from each other. Herein, the robot arms 320 are driven by one pair of the rotation driving units 310 having the rotation shafts 311 concentric to each other.

The robot arms 320 may be disposed with different heights from each other so as to prevent interference from each other when rotated.

As shown in FIGS. 4 and 5, the cassette unit 200 is disposed between the transferring unit 300 and the gate 110, and includes one pair of side walls having a plurality of loading plates 211 for loading a plurality of the substrates 1; and a lower plate 230 for connecting the side walls.

The lower plate 230 is connected to a driving unit 240 so as to be vertically moved up and down.

The cassette unit 200 may be formed of heat endurance material having an excellent thermal conductivity such as aluminum or aluminum alloy.

If the cassette unit 200 is formed of aluminum or aluminum alloy, the substrate 1 can be naturally cooled thus does not require an additional cooling device for cooling the substrate 1.

A temperature controller 250 for controlling a temperature of the stacked substrates 1 may be further installed at the cassette unit 200. The temperature controller 250 serves to cool or heat the stacked substrates 1 in the cassette unit 200 by using gas or a refrigerant, etc.

When the cassette unit 200 is disposed between the transferring unit 300 and the gate 110, the transferring unit 300 rotates between the wafer supporting unit 120 and the cassette unit 200, and transfers the substrate 1 to be processed to the wafer supporting unit 120 or transfers the processed substrate 1 to the cassette unit 200.

The each processing space forming unit forms an independent processing space S for semiconductor processing. Each processing space S has to be provided with an optimum condition for semiconductor processing.

Figure 6:
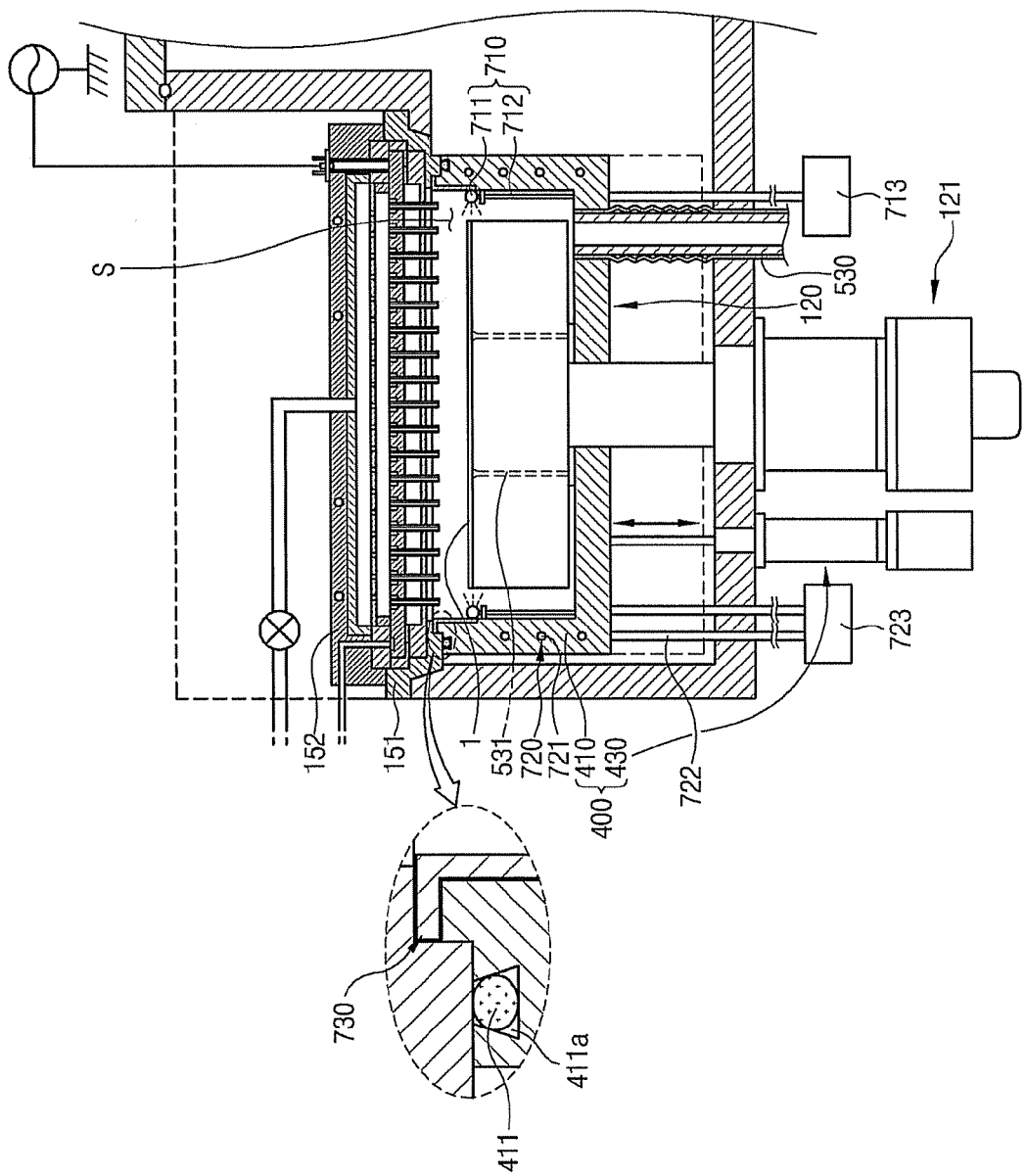
FIG. 6 is a vertical sectional view partially showing an apparatus for semiconductor processing according to a second embodiment of the present invention.
Figure 7:
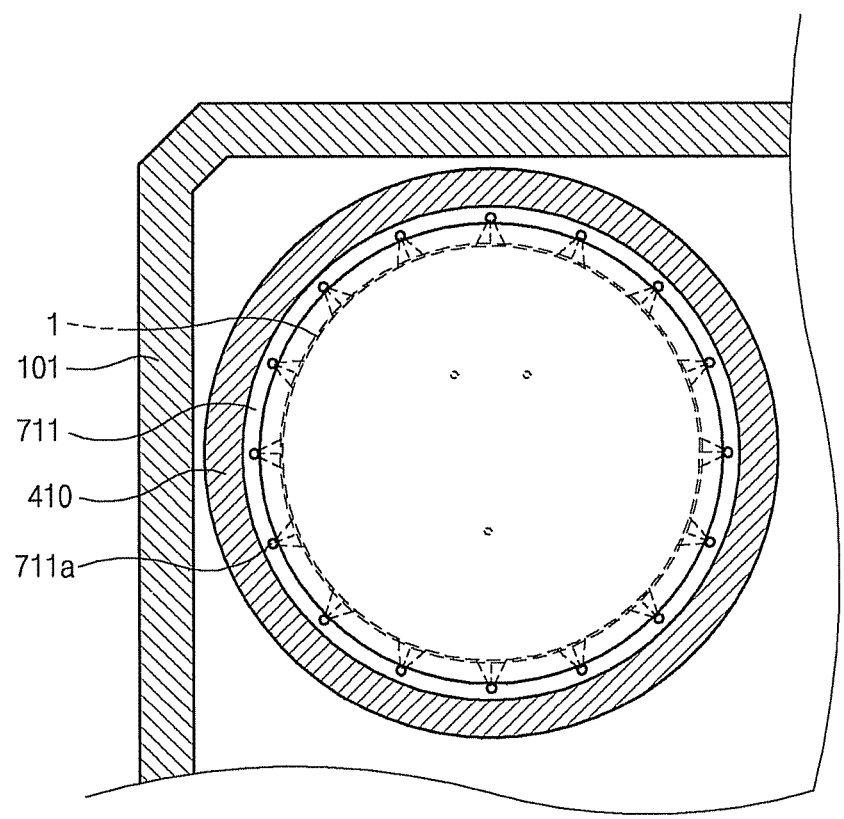
FIG. 7 is a cross-sectional view partially showing the apparatus for semiconductor processing of FIG. 6.

FIG. 6 is a vertical sectional view partially showing an apparatus for semiconductor processing according to a second embodiment of the present invention, and FIG. 7 is a cross-sectional view partially showing the apparatus for semiconductor processing of FIG. 6.

The processing space forming unit may include at least one of a gas injecting unit 710 for injecting gas to an edge of the substrate 1 so as to prevent the edge of the substrate 1 from being deposited; a temperature controller 720 disposed in the cylinder valve 400, for controlling a temperature of the cylinder valve 400 according to a condition of semiconductor processing; and a liner 730 for protecting an O-ring as a sealing member 411 installed at the cylinder valve 400.

The gas injecting unit 710 may be implemented as a gas injecting passage disposed in the cylinder valve body 410 of the cylinder valve 400 for preventing the substrate 1 from being deposited by injecting gas to an edge or a lower surface of the substrate 1. Or as shown in FIGS. 6 and 7, the gas injecting unit 710 may also be implemented as a gas injecting ring 711 having a plurality of injecting holes 711a inside the cylinder valve body 410 and connected to a gas supplying unit 713 installed outside the chamber by a gas supplying pipe 712.

Preferably, the gas injecting unit 710 is disposed so as to inject gas toward a side surface of the substrate 1, more preferably from a lower surface of the substrate 1 toward a side surface of the substrate 1.

The temperature controller 720 is installed at the cylinder valve 400 thus to optimize semiconductor processing such as a depositing process, and controls a temperature of the cylinder valve body 410 so as to attach/detach byproducts to/from an inner wall of the cylinder valve body 410 during semiconductor processing.

The temperature controller 720 may have various configurations such as a structure using refrigerant, a conductor or a heater, etc., and may be installed inside or on an outer wall of the cylinder valve body 410.

For instance, the temperature controller 720 may include a passage 721 formed inside of the wall of the cylinder valve body 410 and along which a fluid flows; a passage pipe 722 connecting the passage 721 and a fluid supplying unit 723 for heating or cooling a fluid and then supplying the heated or cooled fluid to the passage 721 installed outside the chamber.

A plasma for semiconductor processing may apply damage to the sealing member 411, or may make the sealing state of the processing space S worse. Herein, the sealing member 411 is disposed at a sealing member inserting groove 411a formed at the end of the cylinder valve body 410.

The liner 730 formed of a ceramic such as SiC for protecting the sealing member 411 by preventing a plasma occurrence or by shielding heat may be detachably installed at an inner wall of the cylinder valve body 410.

When the liner 730 is installed at the cylinder valve body 410, an outer surface of the liner 730 is preferably disposed to be the same surface as that of the cylinder valve 400 so as to minimize an influence on semiconductor processing.

Preferably, a lower end of the liner 730 is extended lower than a bottom surface of the substrate 1 so as to prevent the cylinder valve body 410 from influencing on a plasma generation.

Preferably, an end of the cylinder valve 400 is stepped between the processing space S and an outer surface of the cylinder valve 400 so as to protect the sealing member 411. Also, a portion of the cylinder valve where the sealing member 411 is installed has a different height from a portion contacting the processing space S.

An operation of the apparatus for semiconductor processing according to the present invention will be explained.

First, the gate 110 is opened by a gate door 111 so that the transferring robot 540 disposed outside the reaction chamber 100 can be transferred into the reaction chamber 100.

Once the gate 110 is opened, the transferring robot 540 loads the substrates 1 to be sequentially semiconductor-processed on the loading plates 211 of the cassette unit 200. Herein, the cassette unit 200 vertically moves so that each substrate 1 can be loaded onto each loading plate 211. When the substrates 1 are completely loaded (stacked) to the cassette unit 200, the gate 110 is closed by the gate door 111.

Accordingly, the reaction chamber 100 does not contact external air, and has an inner pressure lower than the atmospheric pressure by the exhaustion pipe 530. Dust or foreign materials inside the reaction chamber 100 are outwardly discharged.

Differently from the conventional apparatus for semiconductor processing having a cassette unit exposed to the air, the cassette unit 200 of the present invention is installed in the reaction chamber 100 having less particles than in the air. Accordingly, the substrate is prevented from being contaminated by dust and foreign materials during semiconductor processing.

Once the gate 110 is closed by the gate door 111, the transferring unit 300 transfers the substrate 1 loaded in the cassette unit 200 to each wafer supporting unit 120 by being rotatably reciprocated. Herein, the cassette unit 200 vertically moves to be disposed at a desired position so that the substrate 1 can be smoothly transferred to the wafer supporting unit 120. Also, the cylinder valve 400 maintains an opened state, that is, a lowered state of the cylinder valve body 410.

Once the substrate 1 has been transferred to the wafer supporting unit 120 by the transferring unit 300, the wafer supporting unit 120 and the cylinder valve body 410 upwardly move thus to form the processing space S for semiconductor processing. Then, the substrate 1 inside the processing space S starts to undergo semiconductor processing such as an etching process or a depositing process. A vacuum pump controls pressure inside the processing space S so as to be suitable for semiconductor processing by the exhaustion pipe 530.

Once the semiconductor processing for the substrate 1 is completely finished, the apparatus for semiconductor processing reversely performs the above processes.

That is, if the semiconductor processing inside the processing space S of the processing space forming unit is finished, air exhaustion and a pressure inside the processing space S are controlled by the exhaustion pipe 530. Then, the cylinder valve body 410 is lowered thus to open the processing space S. The processed substrate 1 is loaded to the cassette unit 200 by the transferring unit 300.

The substrate 1 loaded to the cassette unit 200 is transferred to another wafer supporting unit 120 of the cylinder valve body 410 by the transferring unit 300 for the next processing, or is carried out of the reaction chamber 100 through the gate door 111 by the robot arm 540.

In the present invention, the processing space forming unit such as the cylinder valve is installed thus to prevent gas occurrence during a processing, and to prevent an interference of plasma sources. Also, a uniform processing atmosphere is implemented thus to enhance a reliability of a processing.

Furthermore, each semiconductor processing can be simultaneously performed, and composite procedures can be successively performed, thereby reducing an entire processing time and enhancing a productivity.

Also, since the cassette unit is disposed at the reaction chamber, the substrate is prevented from being contaminated by dust and foreign materials thus to enhance a yield. Since the substrate is rapidly transferred and a waiting time for cooling the cassette unit formed of heat endurance material is decreased, an entire processing time is reduced thus to enhance a productivity.

Furthermore, the gas injecting unit, the temperature controller, the liner, etc. are installed at the processing space forming unit to form a processing space, an optimum condition for semiconductor processing is implemented thus to implement a uniform processing atmosphere. Accordingly, a reliability for semiconductor processing is enhanced.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An apparatus for semiconductor processing, comprising:
   a reaction chamber having a gate through which a substrate to be processed is transferred;
   a pair of shower heads disposed at an upper side of the reaction chamber, for spraying gas so as to perform semiconductor processing;
   a pair of wafer supporting units disposed at an inner lower side of the reaction chamber in correspondence to each of the shower heads, for supporting the substrate;
   a pair of processing space forming units disposed in the reaction chamber, for forming and sealing a processing space for semiconductor processing surrounding the shower head and the wafer supporting unit;

a pair of exhausting systems respectively connected to the processing space forming units, wherein the exhausting system controls pressure and air exhaustion inside the reaction chamber and the processing space formed by the processing space forming unit; and a transferring unit provided between the wafer supporting units and the gate, for transferring a substrate to be processed to the wafer supporting units, or for carrying out a substrate having been processed through the gate;

wherein the transferring unit comprises a pair of robot arms having one end connected to a rotation driving unit disposed at the reaction chamber, and another end reciprocatingly-rotating between the respective wafer supporting units and the gate, for transferring the substrate;

wherein a cassette unit for loading a plurality of substrates is further disposed between the transferring unit and the gate; and wherein the pair of robot arms respectively transfer substrate to be processed from the cassette to the respective wafer supporting units, and the processed substrate from the respective wafer supporting units to the cassette.

2. The apparatus of claim 1, wherein the robot arms are disposed with different heights from each other so as to prevent interference from each other when rotated.

3. The apparatus of claim 1, wherein the cassette unit is disposed so as to be vertically movable by a driving unit.

4. The apparatus of claim 1, wherein the cassette unit comprises a temperature controller for controlling a temperature of a substrate to be loaded.

5. The apparatus of one of claim 1, wherein the processing space forming unit is implemented as a cylinder valve disposed in the reaction chamber so as to be vertically movable and forming a processing space when upwardly moved.

6. The apparatus of claim 5, wherein a gas injecting unit for injecting gas to an edge portion of a substrate so as to prevent the edge portion of the substrate from being deposited is further provided at the cylinder valve.

7. The apparatus of claim 6, wherein the gas injecting unit comprises:

a gas injecting ring having a plurality of injection holes at an inner side of the cylinder valve, the gas injecting ring being connected a gas supplying unit installed outside by a gas supplying pipe.

8. The apparatus of claim 5, wherein a temperature controller for controlling a temperature of the cylinder valve according to a condition of semiconductor processing is further provided in the cylinder valve.

9. The apparatus of claim 5, wherein a liner for protecting a sealing member is further provided at an inner wall of the cylinder valve.

10. The apparatus of claim 9, wherein a lower end of the liner is extending to be lower than a bottom surface of a substrate so as to prevent a plasma from being generated.

11. The apparatus of claim 9, wherein an end of the cylinder valve is stepped between the processing space and an outer surface of the cylinder valve so as to protect the sealing member, and a portion of the cylinder valve where the sealing member is installed has a different height from a portion contacting the processing space.

* * * * *